(12) United States Patent
Takizawa (10) Patent No.: US 8,304,967 B2
(45) Date of Patent: Nov. 6, 2012

(54) FLEXURAL VIBRATION PIECE, FLEXURAL VIBRATOR, AND ELECTRONIC APPARATUS

(75) Inventor: Teruo Takizawa, Matsumoto (JP)

(73) Assignee: Seiko Epson Corporation (JP)

( * ) Notice: Subject to any disclaimer, the term of this patent is extended or adjusted under 35 U.S.C. 154(b) by 230 days.

(21) Appl. No.: 12/816,530

(22) Filed: Jun. 16, 2010

(65) Prior Publication Data

US 2010/0320875 A1    Dec. 23, 2010

(30) Foreign Application Priority Data

Jun. 17, 2009    (JP) ................................ 2009-143984

(51) Int. Cl.
*H01L 41/09* (2006.01)
*H01L 41/047* (2006.01)

(52) U.S. Cl. ........ 310/370; 310/331; 310/357; 310/365; 310/367; 310/369

(58) Field of Classification Search .................. 310/330, 310/331, 357, 365, 367, 369, 370
See application file for complete search history.

(56) References Cited

U.S. PATENT DOCUMENTS

| | | | | |
|---|---|---|---|---|
| 1,958,014 A * | 5/1934 | Nicholson | ..................... | 310/363 |
| 2,836,737 A * | 5/1958 | Crownover | .................. | 310/331 |
| 2,955,216 A * | 10/1960 | Dieter | ........................... | 310/330 |
| 3,940,974 A * | 3/1976 | Taylor | ........................... | 374/177 |
| 4,087,715 A * | 5/1978 | Myer | ............................ | 310/317 |
| 4,308,546 A * | 12/1981 | Halasz | ............................. | 347/68 |
| 4,629,928 A * | 12/1986 | Hamada et al. | ............... | 310/365 |
| 6,498,651 B1 * | 12/2002 | Loil | ............... | 356/476 |
| 7,312,559 B2 * | 12/2007 | Lee et al. | ...................... | 310/367 |
| 2004/0007065 A1 * | 1/2004 | Fujimoto et al. | ........... | 73/514.15 |

FOREIGN PATENT DOCUMENTS

| | | |
|---|---|---|
| JP | 2008-011348 | 1/2008 |
| JP | 2009-005022 | 1/2009 |
| JP | 2010-226609 | 10/2010 |

\* cited by examiner

*Primary Examiner* — Thomas Dougherty
(74) *Attorney, Agent, or Firm* — Harness, Dickey & Pierce, P.L.C.

(57) ABSTRACT

A flexural vibration piece includes: a base portion; a vibrating arm extending from the base portion and having a first surface, a second surface opposing the first surface, and side surfaces connecting the first surface and second surface, wherein a laminated structure including a first electrode, a second electrode, and a piezoelectric layer disposed between the first electrode and second electrode, is formed on each of the first surface and second surface, the piezoelectric layer formed on the first surface side and the piezoelectric layer formed on the second surface side have mutually opposite polarization directions, and the first electrode formed on the first surface side and the first electrode formed on the second surface side are connected to each other.

7 Claims, 7 Drawing Sheets

FLEXURAL VIBRATION PIECE, FLEXURAL VIBRATOR, AND ELECTRONIC APPARATUS

BACKGROUND

1. Technical Field

The present invention relates to a flexural vibration piece, a flexural vibrator, and an electronic apparatus, which have configurations suitable for downsizing.

2. Related Art

To date, a flexural vibration piece has been disclosed which includes a pair of piezoelectric elements spaced apart on the front surface of a vibrating arm, as disclosed in, for example, JP-A-2008-11348. The flexural vibration piece is such that, by a drive voltage being applied to each of the piezoelectric elements, and each of the piezoelectric elements being deformed, the vibrating arm is caused to flex in a predetermined direction. In this case, the piezoelectric elements, being of a configuration wherein a piezoelectric layer is sandwiched by two electrodes, are such that the drive voltage is applied to the two electrodes, deforming the piezoelectric layer. Also, a configuration has also been disclosed wherein a further pair of piezoelectric elements are provided on the rear surface on the side opposite the front surface, according to which, it is possible to cause the vibrating arm to flex more efficiently. That is, the flexural vibration piece is such that as the piezoelectric elements, which are of a film with good piezoelectric characteristics, are formed on the vibrating arm, and the vibrating arm is caused to flex by deforming the piezoelectric elements, there are less restrictions with respect to the shape of the vibrating arm, and a downsizing is also possible.

Herein, as a restriction with respect to the shape of the vibrating arm, for example, the formation in a vibrating arm which is of a piezoelectric material of a groove for widening an electrode region in order to increase electrical field efficiency, which tends to decrease along with a downsizing, can be cited, as in the case of a vibration piece which does not have a piezoelectric element. A vibrating arm which has a groove, or the like, is such that its rigidity decreases, it is not possible to obtain a stable flexural vibration by utilizing the characteristics of the base material of the vibrating arm, and a downsizing is difficult. Meanwhile, a flexural vibration piece which includes a piezoelectric element is such that the vibrating arm may be of a non-piezoelectric material, and the flexural vibration piece can be downsized while maintaining rigidity.

Furthermore, a flexural vibration piece (the tuning fork type vibrator in JP-A-2009-5022) wherein one piezoelectric element is provided over a wide area on the front surface of a vibrating arm, improving a so-called area efficiency, has been disclosed in, for example, JP-A-2009-5022. In this case, the vibrating arm of the flexural vibration piece synchronizes with the deformation direction of the piezoelectric element, and flexes in the same direction. As the vibrating arm has one piezoelectric element provided over a wide area, the piezoelectric element can maintain a high electrical field, and a further downsizing of the flexural vibration piece is possible. As heretofore described, according to a configuration wherein a piezoelectric element is provided on the front surface of a vibrating arm of a flexural vibration piece, the flexural vibration piece is such that a flexural vibration is obtained by utilizing the characteristics of the base material of the vibrating arm, and it is possible to achieve a downsizing.

However, with the heretofore technology, wires connecting electrodes provided on each vibrating arm, sandwiching the piezoelectric layer, are of a complex configuration adjacent to each other or intersecting across an insulating film. Also, with the configuration wherein a further pair of piezoelectric elements are provided on the rear surface on the side opposite the front surface of the vibrating arm, it can be supposed that the wires, although not specifically disclosed, are more complexly adjacent or intersecting. This kind of complex wiring is such that the intervals between wires narrow along with a downsizing of the flexural vibration piece and, in addition to an increase in parasitic capacity and a greater likeliness of crosstalk occurring, a considerable number of man-hours are needed for the formation of the wiring. Also, by thinning the vibration arm, another problem occurs in that the piezoelectric layer is more easily affected by the electrical field on the opposite surface, which may constitute a factor in impeding the downsizing of the flexural vibration piece.

SUMMARY

An advantage of some aspects of the invention is to solve at least a part of the problems described above and the invention can be realized as the following embodiments or application examples.

Application Example 1

A flexural vibration piece according to this application example includes a base portion, at least one vibrating arm formed extending from the base portion and having a first surface, and a second surface opposing the first surface, a lower electrode formed on the first surface and second surface of the vibrating arm, a piezoelectric layer formed on top of the lower electrode, and an upper electrode formed on top of the piezoelectric layer, wherein the piezoelectric layer formed on the first surface and the piezoelectric layer formed on the second surface have mutually opposite polarization directions with respect to the vibrating arm. Also, in one embodiment, a flexural vibration piece includes a base portion, at least one vibrating arm extending from the base portion and having a first surface, a second surface opposing the first surface, and side surfaces connecting the first surface and second surface, wherein a laminated structure including a first electrode, a second electrode, and a piezoelectric layer sandwiched by the first electrode and second electrode, is formed on each of the first surface and second surface, the piezoelectric layer formed on the first surface and the piezoelectric layer formed on the second surface have mutually opposite polarization directions, and the first electrode formed on the first surface and the first electrode formed on the second surface are connected to each other.

According to this flexural vibration piece, the vibrating arm flexurally vibrates in one direction and another direction differing from the one direction alternately, and has the first surface disposed facing in the one direction, and the second surface opposing the first surface disposed facing in the other direction. The lower electrode (first electrode), piezoelectric layer, and upper electrode (second electrode) are each formed, in order from the vibrating arm side, on the first surface and second surface of the vibrating arm, and the vibrating arm flexurally vibrates due to the piezoelectric effect of the piezoelectric layer. The piezoelectric layer is a film of a material having piezoelectricity formed on top of the lower electrode. Then, the piezoelectric layer formed on the lower electrode on the first surface, being formed so as to have a predetermined orientation with respect to the vibrating arm, has a polarization direction according to the orientation. Also, the piezoelectric layer formed on the lower electrode on the second surface is formed on the lower electrode on the second surface in the same way as the piezoelectric layer formed on the lower electrode on the first surface. Because of this, the piezoelectric layer formed on the lower electrode on the second surface is formed having an orientation in the reverse direction to that of the piezoelectric layer formed on the lower electrode on the first surface with respect to the vibrating arm, and has an opposite polarization direction differing from that of the piezoelectric layer formed on the lower electrode on the first surface. The flexural vibration piece including this kind of configuration includes a characteristic such that, when an electrical field is generated in the same direction in each of the piezoelectric layer formed on the lower electrode on the first surface of the vibrating arm and the piezoelectric layer, formed on the lower electrode on the second surface of the vibrating arm, having an opposite polarization direction differing from that of the piezoelectric layer formed on the lower electrode on the first surface, one of the piezoelectric layers is compressed, and the other piezoelectric layer is stretched. The vibrating arm flexes to the compressing side due to the compression and expansion of the piezoelectric layers, and furthermore, when the direction of the electrical field is changed, the vibrating arm flexes to the opposite side. By alternately changing the direction of the electrical field in this way, the vibrating arm flexurally vibrates in the one direction and the other direction alternately. Consequently, the flexural vibration piece is such that, it being sufficient to generate an electrical field in the same direction in the piezoelectric layers on the first surface side and second surface side in order to cause the vibrating arm to flexurally vibrate, even in the event that one of the piezoelectric layers is affected by the electrical field on the opposite surface side of the vibrating arm, the contraction or expansion of that piezoelectric layer is not impeded. That is, the flexural vibration piece is such that it is possible to make the vibrating arm thinner for the sake of a downsizing.

Application Example 2

With the flexural vibration piece according to the above application example, it is preferable that the lower electrodes formed on the first surface and second surface of the vibrating arm are conductively connected to each other, and that a drive voltage is applied to the upper electrodes formed on the first surface side and second surface side.

According to this configuration, the flexural vibration piece has a configuration the lower electrodes formed on each of the first surface and second surface of the vibrating arm are conductively connected to each other by an electrical connection being made. The drive voltage in the vibrating arm of the flexural vibration piece is applied through a path in the order of the first surface side upper electrode to the piezoelectric layer, lower electrode, conductive connection portion, second surface side lower electrode, piezoelectric layer, and upper electrode, or a path in the reverse order. This is a so-called serial wiring condition. Then, on applying the drive voltage to the serially connected piezoelectric layers on the first surface side and second surface side, the polarization directions of the piezoelectric layers mutually differ, so one piezoelectric layer is compressed, and the other piezoelectric layer is stretched. Also, it being possible to integrally form the lower electrodes and conductive connection portion with this kind of configuration on the perimeter of the vibrating arm simultaneously, there is no need to provide a long wire for a conductive connection, and it is sufficient to provide the vibrating arm with a wire extending from the upper electrode on each of the first surface side and second surface side. Consequently, the flexural vibration piece is such that the wiring for applying the drive voltage is simple, and the wire formation can also be easily carried out. Furthermore, the flexural vibration piece is such that, the wires not being complexly adjacent or intersecting, it is possible to suppress an increase in parasitic capacity, and an occurrence of crosstalk, or the like, even though the flexural vibration piece is downsized.

Application Example 3

A flexural vibration piece according to this application example includes a base portion, at least one vibrating arm formed extending from the base portion and having a first surface, and a second surface opposing the first surface, a lower electrode formed on the first surface and second surface of the vibrating arm, a piezoelectric layer formed on top of the lower electrode, and an upper electrode formed on top of the piezoelectric layer, wherein, when an electrical field is generated by applying a drive voltage between the lower electrodes and upper electrodes, the polarization direction and electrical field direction in the piezoelectric layer formed on one of the first surface and second surface are the same as each other, and the polarization direction and electrical field direction in the piezoelectric layer formed on the other surface are mutually opposite. Also, in one embodiment, when a voltage is applied between the second electrode formed on the first surface and the second electrode formed on the second surface, the polarization direction and an electrical field direction in the piezoelectric layer formed on one of the first surface and second surface are the same as each other, and the polarization direction and electrical field direction in the piezoelectric layer formed on the other surface are mutually opposite. Also, the piezoelectric layer is formed on the first surface, the second surface, and the side surfaces. Also, the first electrodes are electrically floating.

According to this flexural vibration piece, the vibrating arm flexurally vibrates in one direction and another direction differing from the one direction alternately, and has the first surface disposed facing in the one direction, and the second surface disposed facing in the other direction. The lower electrode, piezoelectric layer, and upper electrode are each formed, in order from the vibrating arm side, on the first surface and second surface of the vibrating arm, and the vibrating arm flexurally vibrates due to the piezoelectric effect of the piezoelectric layers. In this case, the vibrating arm is of a configuration such that, in a case in which an electrical field is generated in such a way that the polarization direction and electrical field direction in the piezoelectric layer formed on one surface are the same, an electrical field is generated in such a way that the polarization direction and electrical field direction in the piezoelectric layer formed on the other surface are mutually opposite. Because of this, the one surface of the vibrating arm is compressed, the other surface of the vibrating arm is stretched, and the vibrating arm flexes to the one surface side. Also, the vibrating arm is of a configuration such that, in a case in which an electrical field is generated in such a way that the polarization direction and electrical field direction in the piezoelectric layer formed on the one surface are mutually opposite, an electrical field is generated in such a way that the polarization direction and electrical field direction in the piezoelectric layer formed on the other surface are the same. Because of this, the one surface of the vibrating arm is stretched, the other surface of the vibrating arm is compressed, and the vibrating arm flexes to the other surface side. In this way, due to the generation of an electrical field such as causes the expansion or contraction of the first surface and second surface of the vibrating arm alternately, the vibrating arm flexurally vibrates in the one direction and the other direction alternately. As the flexural vibration piece flexes due to the expansion and contraction of the piezoelectric layer formed on the vibrating arm, and the piezoelectric layer is formed on both surfaces of the vibrating arm, it is possible to cause vibrating arms of a wide variety of materials to reliably vibrate. Also, by forming the piezoelectric layer at one time in such a way as to cover the periphery of the first surface, second surface, and side surfaces of the vibrating arm, it is possible to improve manufacturing efficiency. Also, as the first electrodes are formed in an electrically floating condition, it is possible to easily dispose the electric wires.

Application Example 4

With the flexural vibration piece according to the above application example, it is preferable that the flexural vibration piece has a plurality of vibrating arms formed extending from one end of the base portion.

According to this configuration, the flexural vibration piece is such that, by having the plurality of vibrating arms, it is possible to prevent vibration energy leak, and the like, and it is possible to achieve highly accurate vibration characteristics.

Application Example 5

With the flexural vibration piece according to the above application example, it is preferable that adjacently positioned vibrating arms flexurally vibrate in mutually differing phases.

According to this configuration, in the event that any one vibrating arm of the plurality of vibrating arms of the flexural vibration piece flexes to the first surface side, the vibrating arm adjacent to this vibrating arm is configured in such a way as to flex to the second surface side. By the adjacent vibrating arms each flexurally vibrating in differing directions, that is, flexurally vibrating in mutually differing phases, in this way, the flexural vibration piece is such that, the plurality of vibrating arms being sufficiently balanced, it is possible to maintain a stable vibration with no vibration energy leak.

Application Example 6

A flexural vibration piece manufacturing method according to this application example, being a manufacturing method of a flexural vibration piece including a base portion, and at least one vibrating arm that flexurally vibrates formed extending from the base portion, includes forming a lower electrode on a first surface of the vibrating arm, and on a second surface opposing the first surface, forming piezoelectric layers having mutually opposite polarization directions with respect to the vibrating arm on top of the lower electrodes on the first surface and second surface, and forming upper electrodes on top of the piezoelectric layers.

According to this flexural vibration piece manufacturing method, on the vibrating arm of the flexural vibration piece, the lower electrodes are formed on each of the first surface and second surface of the vibrating arm, the piezoelectric layers are formed on top of the lower electrodes, and furthermore, the upper electrodes are formed on top of the piezoelectric layers, and the vibrating arm flexurally vibrates to the first surface or second surface side alternately. The piezoelectric layers in the piezoelectric layer formation step, of the steps of the manufacturing method, being a film of a material having piezoelectricity formed on top of the lower electrodes, the piezoelectric layer formed on the lower electrode on the first surface is formed so as to have a predetermined orientation with respect to the vibrating arm, and has a polarization direction according to the orientation. Also, the piezoelectric layer formed on the lower electrode on the second surface, being formed on the lower electrode on the second surface in the same way as the piezoelectric layer formed on the lower electrode on the first surface, is formed having an orientation in the reverse direction to that of the piezoelectric layer formed on the lower electrode on the first surface with respect to the vibrating arm, and has an opposite polarization direction differing from that of the piezoelectric layer formed on the lower electrode on the first surface. The flexural vibration piece manufactured with this kind of configuration is such that, when an electrical field is generated in the same direction in the piezoelectric layers on the first surface side and second surface side, one of the piezoelectric layers is compressed, the other piezoelectric layer is stretched, and the vibrating arm flexes. Furthermore, when the direction of the electrical field is changed, the vibrating arm flexes to the opposite side, and by alternately changing the direction of the electrical field, the vibrating arm flexurally vibrates. Consequently, the flexural vibration piece is such that, by generating an electrical field in the same direction in the piezoelectric layers on the first surface side and second surface side, even in the event that one of the piezoelectric layers is affected by the electrical field on the opposite surface side of the vibrating arm, the contraction or expansion of that piezoelectric layer is not impeded, and a stable flexural vibration can be carried out. According to the manufacturing method whereby the piezoelectric layers on the first surface side and second surface side are formed so as to have mutually differing polarization directions in this way, it is possible to make the vibrating arm thinner, and a further downsizing of the flexural vibration piece is possible.

Application Example 7

With the flexural vibration piece manufacturing method according to the above application example, it is preferable in the lower electrode formation step that the lower electrodes formed on the first surface and second surface of the vibrating arm are conductively connected to each other.

According to the method, in the lower electrode formation step, the vibrating arm of the flexural vibration piece is of a configuration such that the lower electrodes on the first surface and second surface are formed in such a way that an electrical connection is made, and are conductively connected to each other. By the lower electrodes being conductively connected to each other, the drive voltage in the vibrating arm of the flexural vibration piece is applied serially through a path in the order of the first surface side upper electrode to the piezoelectric layer, lower electrode, conductive connection portion, second surface side lower electrode, piezoelectric layer, and upper electrode, or a path in the reverse order. It being possible to integrally form the conductively connected lower electrodes and conductive connection portion with this kind of configuration on the perimeter of the vibrating arm simultaneously, there is no need to provide a long wire for a conductive connection, and it is sufficient to provide the vibrating arm with a wire extending from the upper electrode on each of the first surface side and second surface side. Consequently, the flexural vibration piece according to the manufacturing method including the lower electrode formation step is such that the wiring for applying the drive voltage is simple, without being complexly adjacent or intersecting, and the formation thereof can also be easily carried out.

Application Example 8

A flexural vibration device according to this application example includes the flexural vibration piece according to the above application example, and a semiconductor element which drives the flexural vibration piece. Also, in one embodiment, there is provided a flexural vibrator which houses the flexural vibration piece according to the above application example in a package. Also, there is provided an electronic apparatus in which the flexural vibration piece according to the above application example is used.

According to the flexural vibration device and electronic apparatus, they include a flexural vibration piece in which the vibrating arm is made thinner, and a semiconductor element, and as well as a further downsizing being achieved along with a downsizing of the flexural vibration piece, they have highly accurate vibration characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereafter, a description will be given, in accordance with the drawings, of a specific embodiment of a flexural vibration piece and a manufacturing method of the flexural vibration piece. The flexural vibration piece of the embodiment being characterized in the configuration of a piezoelectric layer and a lower electrode (a first electrode), as a specific example thereof, a description will be given of a case in which these characteristic configurations are applied to a crystal vibration piece wherein three vibrating arms carry out a so-called out-of-plane vibration. In the drawings, the scale of each portion of the flexural vibration piece depicted being made partially different, one portion is emphasized for ease of understanding.

Embodiment

Figure 1A:
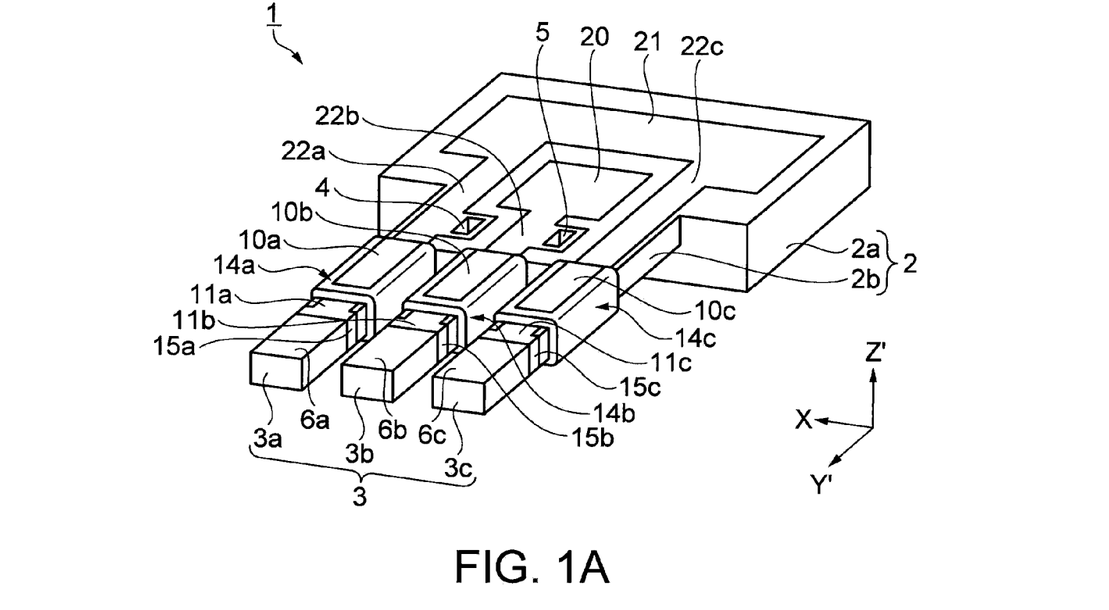
FIG. 1A is a perspective view showing an external appearance of a crystal vibration piece according to an embodiment seen from the front side.
Figure 1B:
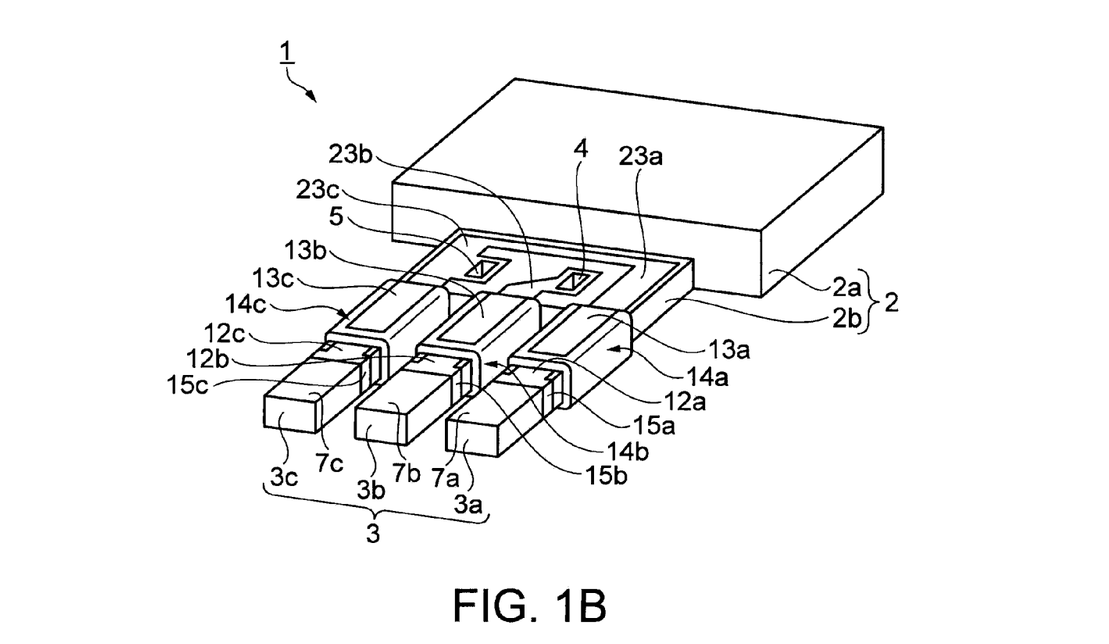
FIG. 1B is a perspective view showing an external appearance of the crystal vibration piece seen from the rear side.

FIG. 1A is a perspective view showing an external appearance of the crystal vibration piece according to the embodiment seen from the front side, and FIG. 1B is a perspective view showing an external appearance of the crystal vibration piece seen from the rear side. Also, FIG. 2A being a perspective view showing the configuration of the piezoelectric layer seen from the front side, and FIG. 2B a perspective view showing the configuration of the piezoelectric layer seen from the rear side, they show details of the piezoelectric layer by displaying a partial cross-section. The crystal vibration piece (flexural vibration piece) 1 is such that the side on which a main portion 2a and a thin portion 2b of a base portion 2 are in the same plane is the front side, as shown in FIG. 1A, the side on which the main portion 2a and thin portion 2b of the base portion 2 form a level difference is the rear side, as shown in FIG. 1B, and the front-rear direction is the thickness.

The crystal vibration piece 1, as shown in FIGS. 1A, 1B, 2A, and 2B, includes the base portion 2, and three vibrating arms 3 (3a, 3b, and 3c). The base portion 2 has the cuboid main portion 2a, and the cuboid thin portion 2b, formed extending from a longitudinal side of the main portion 2a and of a width shorter than the length of the longitudinal side, whose front side is in the same plane as the main portion 2a, whose rear side forms a level difference with the main portion 2a, and whose thickness is less by the size of the level difference. The thin portion 2b having two rectangular holes passing through the front side and rear side, one is a through hole 4 formed toward the vibrating arm 3a, and one is a through hole 5 formed toward the vibrating arm 3c. Also, the vibrating arms 3a, 3b, and 3c are formed extending in a direction opposite the direction from the thin portion 2b to the main portion 2a, have the same thickness as the thin portion 2b, and are disposed at equal intervals in the longitudinal direction of the base portion 2.

Figure 2A:
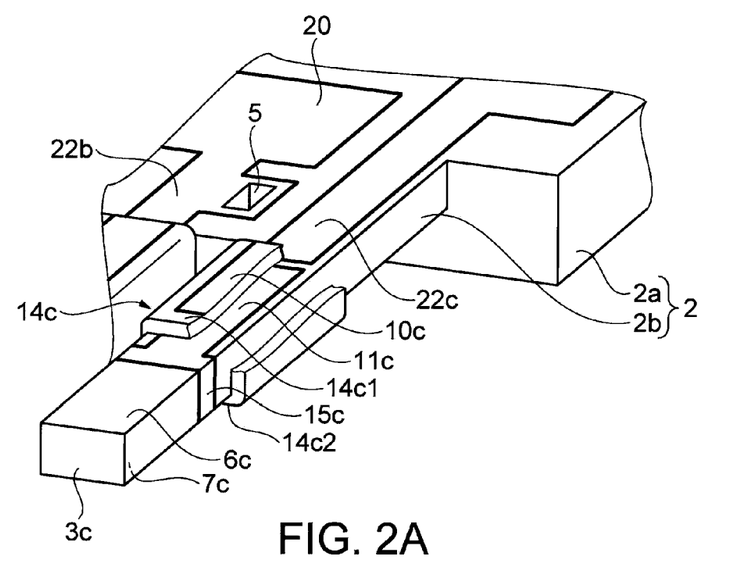
FIG. 2A is a perspective view showing a configuration of a piezoelectric layer seen from the front side.
Figure 2B:
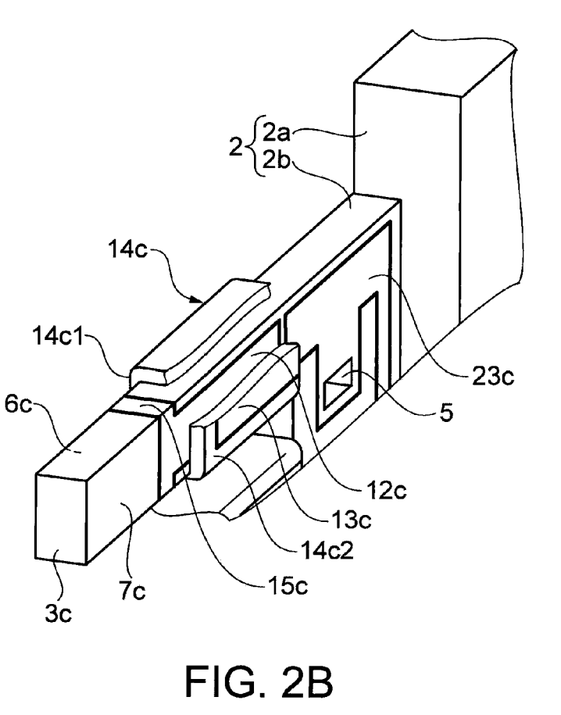
FIG. 2B is a perspective view showing a configuration of the piezoelectric layer seen from the rear side.

Next, a description will be given of the vibrating arms 3, with the vibrating arm 3c of which a detailed cross-section is shown in FIGS. 2A and 2B as a representative. The vibrating arm 3c, being of a cuboid columnar shape, has a first surface 6c forming one surface with the base portion 2 on the front side, and a second surface 7c forming a level difference with the base portion 2 on the rear side. Then, a metal film lower electrode 11c is formed on the first surface 6c of the vibrating arm 3c as a first electrode. In the same way, a metal film lower electrode 12c is formed on the second surface 7c of the vibrating arm 3c as a first electrode. The lower electrode 11c and lower electrode 12c are electrically connected (conductively connected) at an electrode end portion positioned at a leading end portion side, which is the side of the vibrating arm 3c opposite that of the base portion 2, by an electrode connection portion 15c formed extending to both sides from the electrode end portion.

Also, a piezoelectric layer 14c is formed girdling the whole perimeter of the vibrating arm 3c in such a way as to cover each of the lower electrodes 11c and 12c. Furthermore, a metal film upper electrode 10c is formed as a second electrode on a piezoelectric layer surface 14c1 of the piezoelectric layer 14c positioned on the first surface 6c side. In the same way, a metal film upper electrode 13c is formed as a second electrode on a piezoelectric layer surface 14c2 of the piezoelectric layer 14c positioned on the second surface 7c side. That is, the piezoelectric layer 14c is sandwiched on each of the first surface 6c and second surface 7c by the lower electrodes 11c and 12c and upper electrodes 10c and 13c. In this way, the vibrating arm 3c forms a laminated structure having the lower electrode 11c, the piezoelectric layer 14c, and the upper electrode 10c formed stacked in order on the first surface 6c, and the lower electrode 12c, the piezoelectric layer 14c, and the upper electrode 13c formed stacked in order on the second surface 7c.

In the same way as the vibrating arm 3c, the vibrating arm 3a forms a laminated structure having a lower electrode 11a, a piezoelectric layer 14a, and an upper electrode 10a formed stacked in order on a first surface 6a, and a lower electrode 12a, a piezoelectric layer 14a, and an upper electrode 13a formed stacked in order on a second surface 7a. In the same way, the vibrating arm 3b forms a laminated structure having a lower electrode 11b, a piezoelectric layer 14b, and an upper electrode 10b formed stacked in order on a first surface 6b, and a lower electrode 12b, a piezoelectric layer 14b, and an upper electrode 13b formed stacked in order on a second surface 7b.

Then, an electrode wire 22a formed extending from the upper electrode 10a of the vibrating arm 3a along the outer edge of the thin portion 2b and main portion 2a of the base portion 2, an electrode wire 22c formed extending from the upper electrode 10c of the vibrating arm 3c along the outer edge of the thin portion 2b and main portion 2a of the base portion 2, and an electrode terminal 21 formed connected to the electrode wire 22a and electrode wire 22c, are provided on the front side of the crystal vibration piece 1. The electrode wire 22a, electrode terminal 21, and electrode wire 22c extend forming a U shape along the outer edge of the base portion 2. Also, an electrode wire 22b connecting an electrode terminal 20 and the upper electrode 10b of the vibrating arm 3b is formed on the interior side of the electrode wire 22a, electrode terminal 21, and electrode wire 22c forming the U shape. The electrode wire 22a, electrode wire 22b, electrode wire 22c, electrode terminal 20, and electrode terminal 21 formed on the front side of the base portion 2 in this way are formed of the same metal film as the upper electrodes 10a, 10b, and 10c.

Furthermore, in the through hole 4, a metal film is formed extending from the electrode wire 22a to the hole wall of the through hole 4, and in the same way, in the through hole 5, a metal film is formed extending from the electrode wire 22b to the hole wall of the through hole 5. That is, the configuration is such that the front and rear of the thin portion 2b can be connected by a metal film via the through holes 4 and 5.

Meanwhile, an electrode wire 23a formed extending from the upper electrode 13a of the vibrating arm 3a along the outer edge of the thin portion 2b of the base portion 2, and an electrode wire 23c formed extending from the upper electrode 13c of the vibrating arm 3c along the outer edge of the thin portion 2b of the base portion 2, are provided on the rear side of the crystal vibration piece 1. The electrode wire 23a and electrode wire 23c are connected to each other forming a U shape along the outer edge of the thin portion 2b. Also, an electrode wire 23b extending from the upper electrode 13b of the vibrating arm 3b is formed on the interior side of the electrode wire 23a and electrode wire 23c forming the U shape. The electrode wire 23a, electrode wire 23b, and electrode wire 23c formed on the rear side of the thin portion 2b in this way are formed of the same metal film as the upper electrodes 13a, 13b, and 13c.

Furthermore, in the through hole 4, a metal film is formed extending from the electrode wire 23b to the hole wall of the through hole 4, and in the same way, in the through hole 5, a metal film is formed extending from the electrode wire 23c to the hole wall of the through hole 5. That is, the electrode wire 22a on the front side of the thin portion 2b and the electrode wire 23b on the rear side of the thin portion 2b are electrically connected via the through hole 4, and the electrode wire 22b on the front side of the thin portion 2b and the electrode wire 23c on the rear side of the thin portion 2b are electrically connected via the through hole 5.

Figure 3:
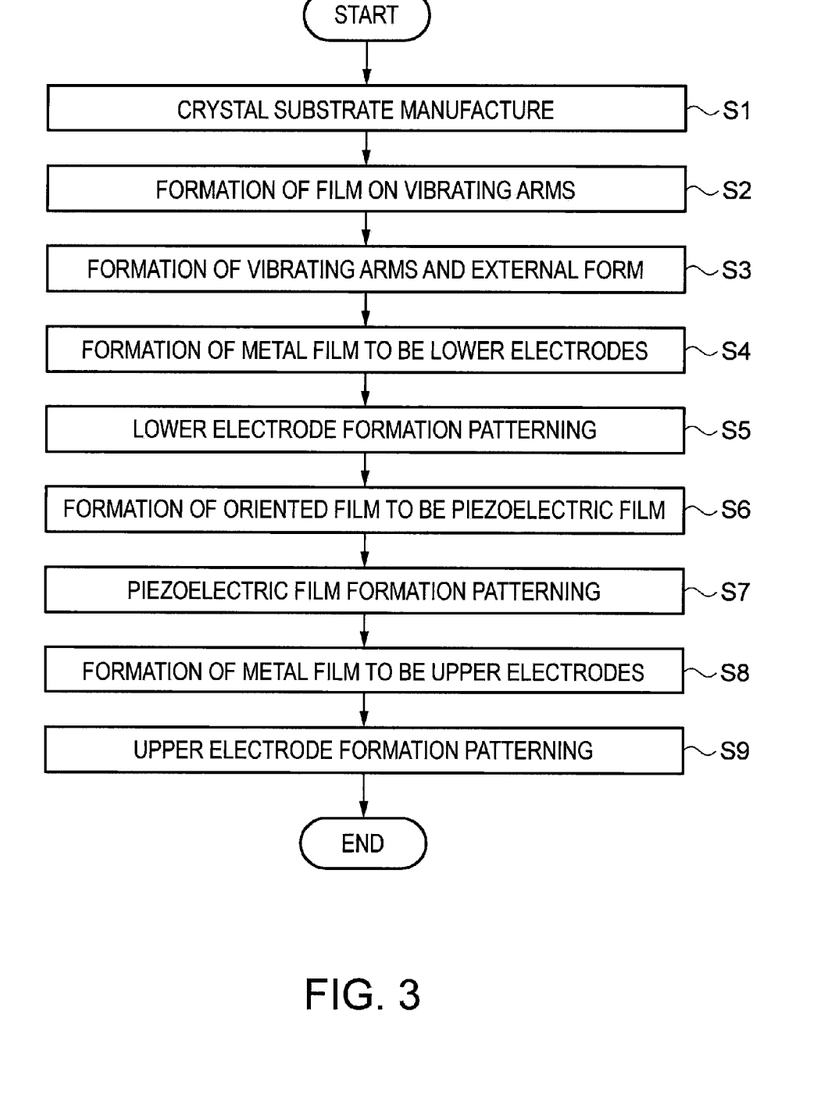
FIG. 3 is a flowchart showing a manufacturing process of the crystal vibration piece.

With regard to the crystal vibration piece 1 with the heretofore described configuration, a more detailed description will be given of a formation method, material, and function of the upper electrodes 10 and 13, piezoelectric layers 14, lower electrodes 11 and 12, electrode connection portions 15, and the like. FIG. 3 is a flowchart showing a manufacturing process of the crystal vibration piece. Firstly, in step S1, a crystal substrate 30 is manufactured, and subsequently, in step S2, the portion of the vibrating arm portion in which the vibrating arms 3 are formed is thinned. Herein, FIG. 4A, being a perspective view showing a condition wherein the vibrating arm portion of the crystal substrate is thinned, shows the crystal substrate 30 after steps S1 and S2 are finished.

Figure 4A:
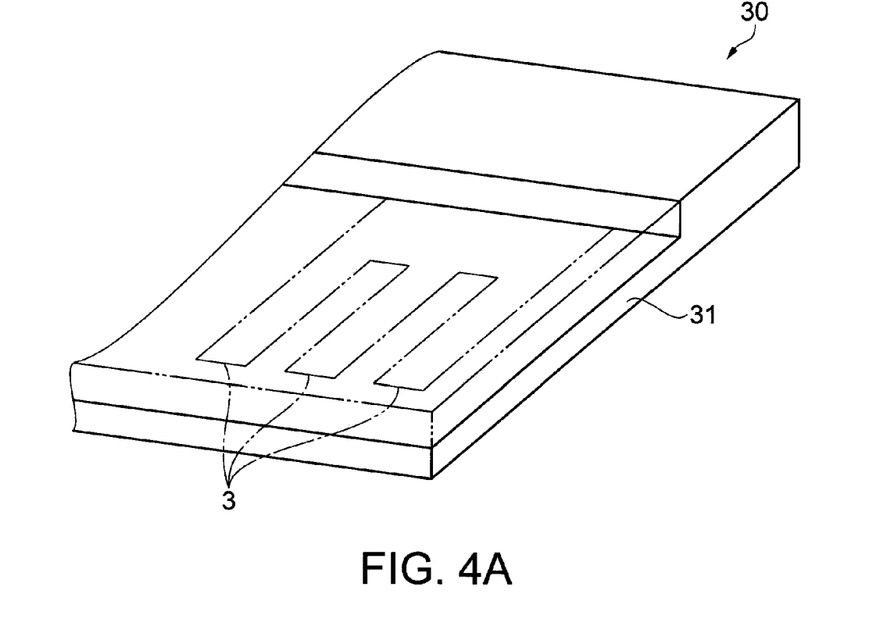
FIG. 4A is a perspective view showing a condition wherein a vibrating arm portion of a crystal substrate is thinned.

The crystal substrate 30 is cut out of a crystal column which is a piezoelectric single crystal material. The crystal column, being a hexagonal column, has a Z axis which is an optical axis in the longitudinal direction of the column and, in an X-Y plane of a hexagonal surface perpendicular to the Z axis, an X axis which is an electrical axis parallel to the sides of the hexagonal form, and a Y axis which is a mechanical axis perpendicular to the X axis. This kind of crystal has a characteristic such that, when a voltage is applied in the X axis (electrical axis) direction, a phenomenon of an extension or contraction in the Y axis (mechanical axis) direction occurs in accordance with the direction of the applied voltage, and conversely, when an extension or compression is applied in the Y axis (mechanical axis) direction, a voltage is generated in the X axis (electrical axis) direction. That is, the crystal can convert between electrical energy and mechanical energy. In order to efficiently utilize this characteristic of the crystal, in this case, a crystal substrate 30 further cut out of a crystal wafer (not shown) cut out along an X-Y' plane tilted approximately one to five degrees around the X axis in the X-Y plane of the crystal column is used. The crystal substrate 30 has its thickness in a Z' direction, which is a front-rear direction in a thin plate form along the X-Y' plane. The crystal substrate 30 cut out in this way has a characteristic of vibrating stably in the thickness direction. In step S2, a thin-walled portion 31 is formed by thinning the portion of the crystal substrate 30 in which the vibrating arms 3 are formed. After the formation of the thin-walled portion 31, the flow proceeds to step S3.

Figure 4B:
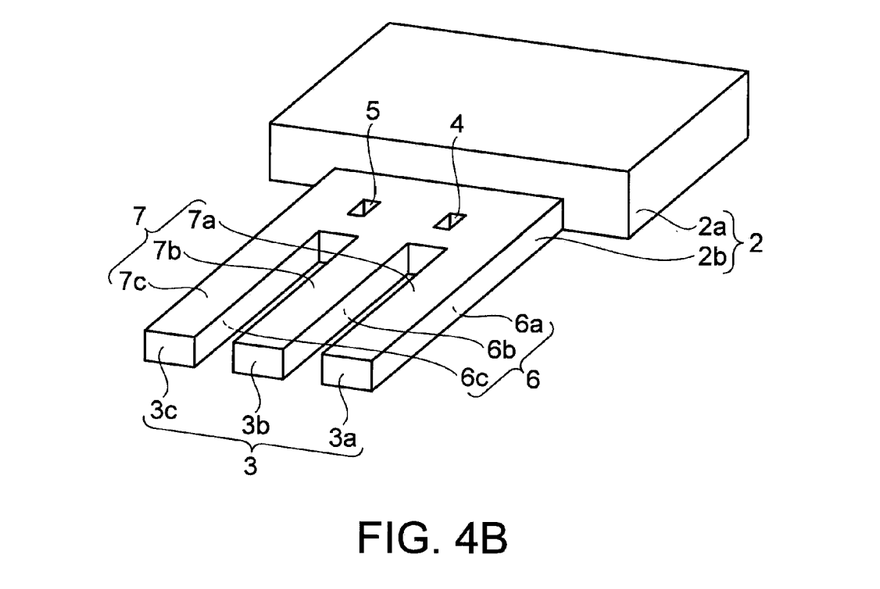
FIG. 4B is a perspective view showing a formation of vibrating arms.

In step S3, the vibrating arms 3 and external form are formed. FIG. 4B is a perspective view showing the formation of the vibrating arms. As shown in FIG. 4B, as well as the external form of the crystal vibration piece 1 (FIGS. 1A and 1B) being formed by being cut out of the crystal substrate 30, the thin portion 2b of the base portion 2, the three vibrating arms 3 (3a, 3b, and 3c), and the through holes 4 and 5, are formed in the thin-walled portion 31 of the crystal substrate 30. The external form and vibrating arms 3, including the through holes 4 and 5, are cut out utilizing an anisotropic etching which uses buffered hydrofluoric acid (BHF), in which case, the thickness of the main portion 2a in the base portion 2 is formed to 50 μm, and the thickness of the vibrating arms 3 to 10 μm or less. Then, the surfaces of the vibrating arms 3, which are cuboid columns, forming the same plane as the base portion 2 are the first surfaces 6 (6a, 6b, and 6c), and the surfaces in the same plane as the thin portion 2b of the base portion 2 forming a level difference with the main portion 2a are the second surfaces 7 (7a, 7b, and 7c). Step S3 corresponds to a vibrating arm formation step. After the formation of the vibrating arms 3 and the like, the flow proceeds to step S4.

Figure 5C:
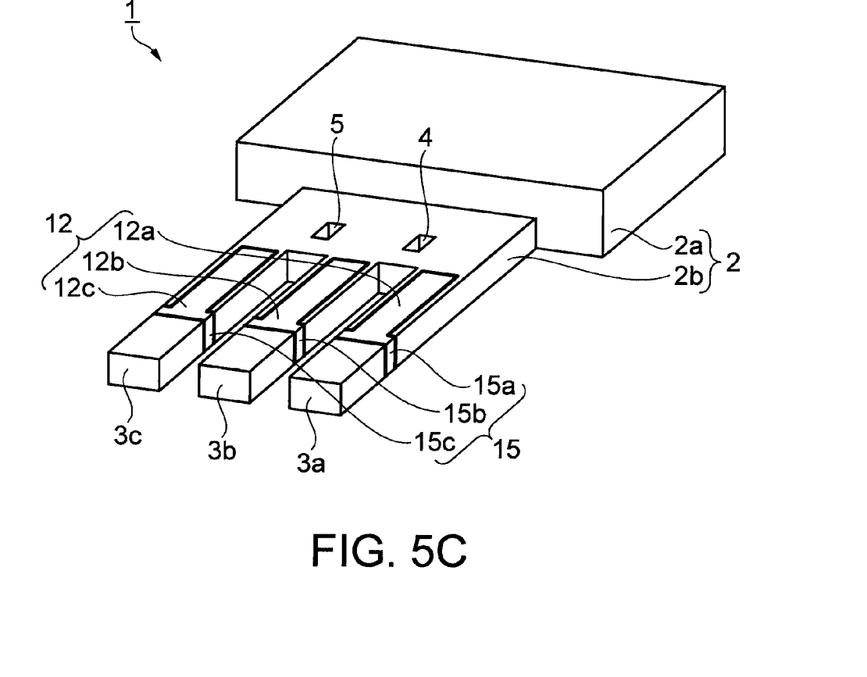
FIG. 5C is a perspective view showing a formation of lower electrodes.

In step S4, the metal film which is to be the lower electrodes 11 and 12 is formed. Next, in step S5, a lower electrode formation patterning is carried out. FIG. 5C is a perspective view showing the formation of the lower electrodes. The rear side lower electrodes 12 (12a, 12b, and 12c) and the electrode connection portions 15 (15a, 15b, and 15c) extending from the lower electrodes 12, after the formation is finished in step S5, are shown in FIG. 5C. Although the lower electrodes 11 are not shown in the drawing, the lower electrodes 11 (11a, 11b, and 11c), which are the same as the lower electrodes 12, are formed on the front side in a condition in which they are connected to the electrode connection portions 15 (15a, 15b, and 15c). The lower electrodes 11 and 12 and electrode connection portions 15, in this case, are a metal film of a two-layer structure wherein titanium (Ti) is formed as a lower layer film, and platinum (Pt) is formed on top of the titanium (Ti) as an upper layer film. The metal film with the two-layer structure is formed to a total thickness of around 0.1 μm.

Herein, a simple description will be given of the metal film formation and patterning forming the lower electrodes 11 and 12 and electrode connection portions 15. Firstly, a film is formed over the whole of the base portion 2 and vibrating arms 3 by sputtering titanium (Ti), and a film is formed on top of the titanium (Ti) by sputtering platinum (Pt) in the same way. Next, a resist agent is applied over the whole of the platinum (Pt). Then, after leaving the resist in the portions of the lower electrodes 11 and 12 and electrode connection portions 15 using photolithography, the titanium (Ti) and platinum (Pt) films are removed by means of a wet etching process (for example, an aqua regia process) except in the portions in which the resist remains, and the remaining resist is also removed. Also, a dry etching may be used instead of the wet etching process. In this way, the lower electrodes 11 and 12 and electrode connection portions 15 are integrally formed. Because of this, the lower electrodes 11 and lower electrodes 12 are connected (conductively connected) to each other via the electrode connection portions 15 in such a way that an electrical continuity is possible. Steps S4 and S5 correspond to lower electrode formation steps. After the formation of the lower electrodes 11 and 12 and the like, the flow proceeds to step S6.

Figure 5D:
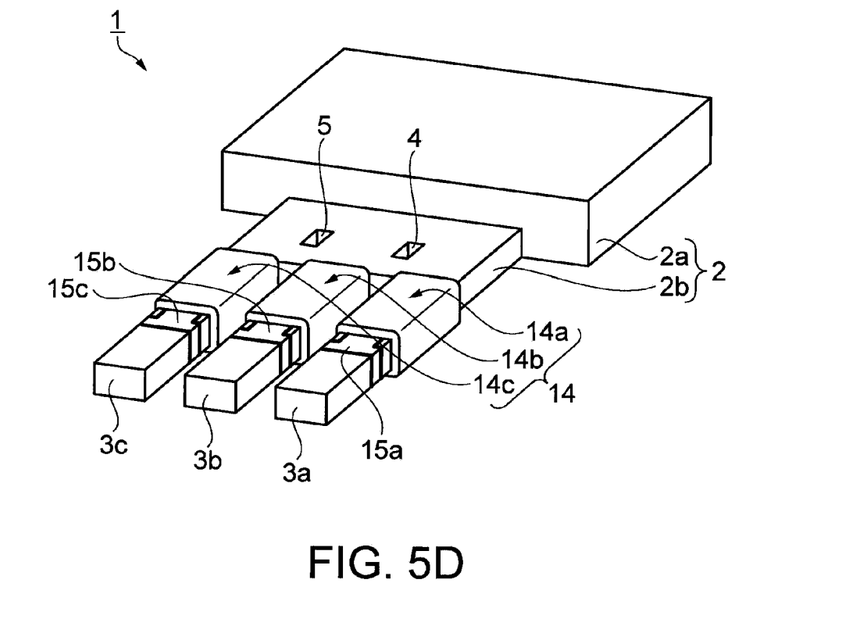
FIG. 5D is a perspective view showing a formation of the piezoelectric layers.

In step S6, the oriented film which is to be the piezoelectric layers 14 is formed. Next, in step S7, a piezoelectric layer formation patterning is carried out. FIG. 5D is a perspective view showing the formation of the piezoelectric layers. The piezoelectric layers 14 are formed by means of a reactive sputtering to a thickness of around 0.1 to 0.5 μm covering the lower electrodes 11 and lower electrodes 12 of the vibrating arms 3, and in this case, are of aluminum nitride (AlN) having piezoelectricity. Aluminum nitride (AlN) has a characteristic that, when prismatic crystals grow during the film formation using the reactive sputtering, the orientation aligns, and polarization inversion is difficult. Therein, in order to further utilize this characteristic, platinum (Pt), which tends to promote the advantage of aligning the orientation of the aluminum nitride (AlN), is used as the upper layer film of the lower electrodes 11 and 12 on which the aluminum nitride (AlN) is formed.

As a metal film other than platinum which has a possibility of promoting the orientation of the aluminum nitride, there is Au, Al, Ag, Cu, Mo, Cr, Nb, W, Ni, Fe, Ti, Co, Zn, Zr, and the like.

For the formation of the piezoelectric layers 14, firstly, an aluminum nitride (AlN) film is formed over the whole of the vibrating arms 3 by means of a reactive sputtering. At this time, the piezoelectric layers 14 formed covering the lower electrodes 11 of the first surfaces 6 (FIG. 1A), and the piezoelectric layers 14 formed covering the lower electrodes 12 of the second surfaces 7 (FIG. 1B), are such that the prismatic crystals of the aluminum nitride (AlN) each grow in a direction approximately perpendicular to the platinum (Pt) film surface. That is, the direction in which the prismatic crystals of the aluminum nitride (AlN) film formed on the lower electrodes 11 grow, and the direction in which the prismatic crystals of the aluminum nitride (AlN) film formed on the lower electrodes 12 grow, are opposite directions with respect to the vibrating arms 3, and the orientations are also reversed with respect to the vibrating arms 3. Because of this, the piezoelectric layers 14 formed on the first surfaces 6 of the vibrating arms 3, and the piezoelectric layers 14 formed on the second surfaces 7, have mutually opposite directions of polarization with respect to the vibrating arms 3.

Then, in the same way as when forming the lower electrodes 11 and 12, the patterning of the piezoelectric layers 14 is carried out. That is, after the application of a resist, unnecessary portions of the aluminum nitride (AlN) are removed so that the piezoelectric layers 14 remain in a ring form on the periphery of the vibrating arms 3 covering each of the lower electrodes 11 and 12. The removal of the aluminum nitride (AlN) being carried out using a strongly alkaline water soluble agent, in this case, tetramethylammonium hydroxide (TMAH) is used. Steps S6 and S7 correspond to piezoelectric layer formation steps. After the formation of the piezoelectric layers 14, the flow proceeds to step S8.

Figure 6E:
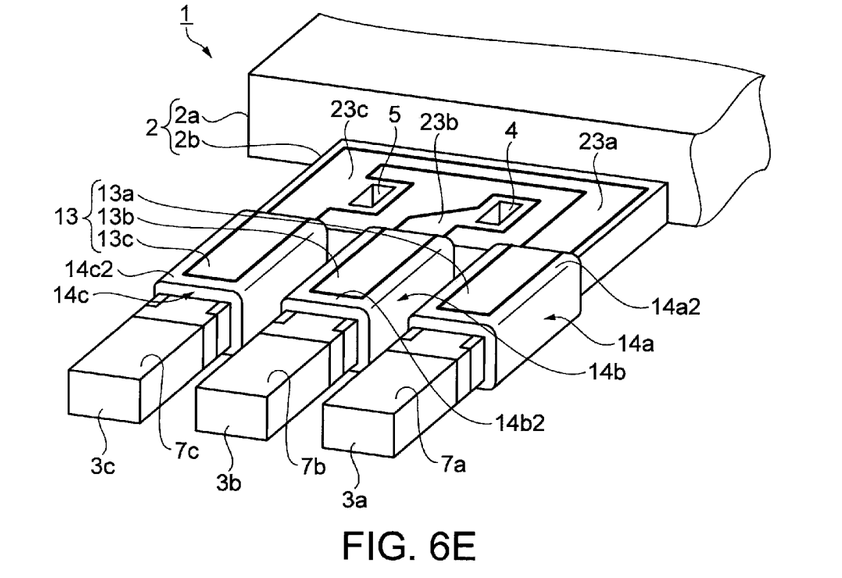
FIG. 6E is a perspective view showing a formation of rear side upper electrodes.
Figure 6F:
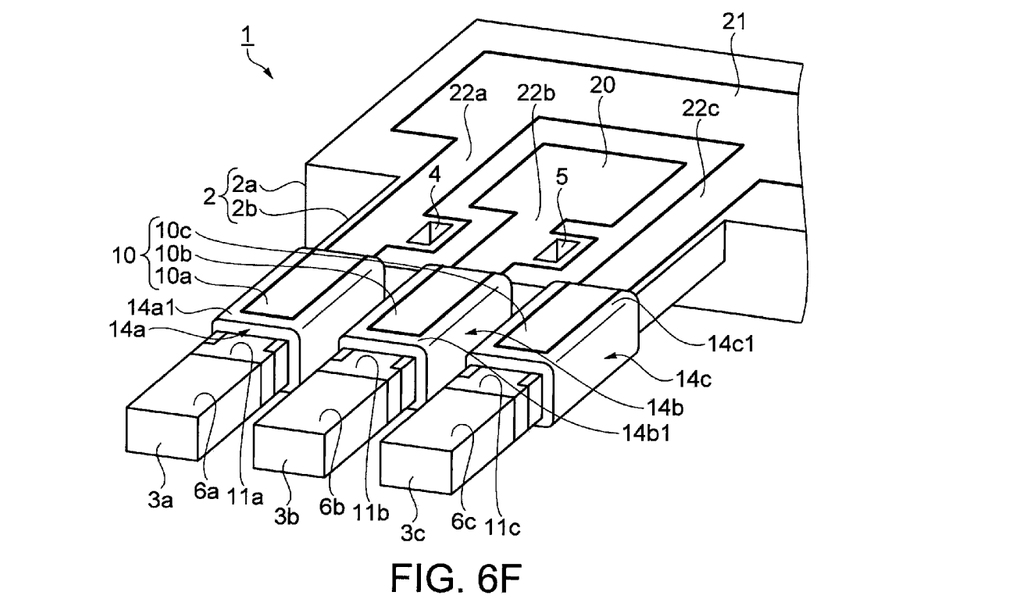
FIG. 6F is a perspective view showing a formation of front side upper electrodes.

In step S8, the metal film which is to be the upper electrodes 10 and 13 is formed. Next, in step S9, an upper electrode formation patterning is carried out. FIG. 6E is a perspective view showing the formation of the rear side upper electrodes, and FIG. 6F is a perspective view showing the formation of the front side upper electrodes. Although the front and rear upper electrodes 10 and 13 are formed simultaneously in steps S8 and S9, firstly, a description will be given of the formation of the rear side upper electrodes 13 (13a, 13b, and 13c), referring to FIG. 6E. When forming the upper electrodes 13, the already described electrode wires 23 (23a, 23b, and 23c) are also formed at the same time. The upper electrodes 13 and electrode wires 23, in this case, are a metal film of a two-layer structure wherein chrome (Cr) is formed as a lower layer film, and gold (Au) is formed on top of the chrome (Cr) as an upper layer film. The metal film with the two-layer structure is formed to a total thickness of around 0.1 μm.

Herein, of the upper electrodes 13, the upper electrode 13a positioned on the rear side of the vibrating arm 3a is formed on top of a piezoelectric layer surface 14a2 opposing the second surface 7a, of the four surfaces of the piezoelectric layer 14a formed in a ring form on the periphery of the vibrating arm 3a. In the same way, the upper electrode 13b positioned on the rear side of the vibrating arm 3b is formed on top of a piezoelectric layer surface 14b2 opposing the second surface 7b, of the four surfaces of the piezoelectric layer 14b formed in a ring form on the periphery of the vibrating arm 3b, and the upper electrode 13c is formed on top of a piezoelectric layer surface 14c2 opposing the second surface 7c. Also, the electrode wires 23 (23a, 23b, and 23c) are formed extending from the upper electrodes 13 (13a, 13b, and 13c) on the rear side of the thin portion 2b of the base portion 2.

The metal film formation and patterning forming the upper electrodes 13 and electrode wires 23 with this kind of disposition are such that, firstly, a film is formed over the whole of the base portion 2, vibrating arms 3, and piezoelectric layers 14 by sputtering chrome (Cr), and a film is formed on top of the chrome (Cr) by sputtering gold (Au) in the same way. Next, a resist agent is applied over the whole of the gold (Au). Then, using photolithography, the resist is left only in the portions of the upper electrodes 13 and electrode wires 23. Subsequently, the chrome (Cr) and gold (Au) films are removed by means of a wet etching process except in the portions in which the resist remains, and the remaining resist is also removed. In this way, the upper electrodes 13 and electrode wires 23 are integrally formed. Herein, the metal film with the two-layer structure of chrome (Cr) and gold (Au) is also formed on the hole walls of the through holes 4 and 5.

Next, a description will be given of the formation of the front side upper electrodes 10, referring to FIG. 6F. When forming the upper electrodes 10 (10a, 10b, and 10c), the already described electrode terminals 20 and 21, and electrode wires 22 (22a, 22b, and 22c), are also formed at the same time. The upper electrodes 10, electrode terminals 20 and 21, and electrode wires 22, in the same way as the upper electrodes 13, are a metal film with a two-layer structure of chrome (Cr) and gold (Au).

Herein, of the upper electrodes 10, the upper electrode 10a positioned on the front side of the vibrating arm 3a is formed on top of a piezoelectric layer surface 14a1 opposing the first surface 6a, of the four surfaces of the piezoelectric layer 14a formed in a ring form on the periphery of the vibrating arm 3a. In the same way, the upper electrode 10b positioned on the front side of the vibrating arm 3b is formed on top of a piezoelectric layer surface 14b1 opposing the first surface 6b, and the upper electrode 10c is formed on top of a piezoelectric layer surface 14c1 opposing the first surface 6c. Also, the electrode terminals 20 and 21, and electrode wires 22, are formed extending from the upper electrodes 10 on the front side of the main portion 2a and thin portion 2b of the base portion 2.

The upper electrodes 10, electrode terminals 20 and 21, and electrode wires 22 with this kind of disposition are integrally formed by a metal film formation by means of sputtering, and a patterning by means of photolithography and acid treatment, being carried out at the same time as the formation of the upper electrodes 13 and electrode wires 23. At this time, in the through hole 4, the metal film of chrome (Cr) and gold (Au) is formed extending from the electrode wire 22a and electrode wire 23b to the hole wall of the through hole 4, and in the same way, in the through hole 5, the metal film is formed extending from the electrode wire 22b and electrode wire 23c to the hole wall of the through hole 5.

Because of this, the upper electrode 10a, electrode wire 22a, electrode terminal 21, electrode wire 22c, and upper electrode 10c on the front side of the crystal vibration piece 1, and the electrode wire 23b and upper electrode 13b on the rear side, are connected by the metal film via the through hole 4. Also, the upper electrode 10b, electrode wire 22b, and electrode terminal 20 on the front side of the crystal vibration piece 1, and the upper electrode 13c, electrode wire 23c, electrode wire 23a, and upper electrode 13a on the rear side, are connected by the metal film via the through hole 5. Steps S8 and S9 correspond to upper electrode formation steps. After the formation of the upper electrodes 10 and 13, and the like, the flow is finished.

Figure 7A:
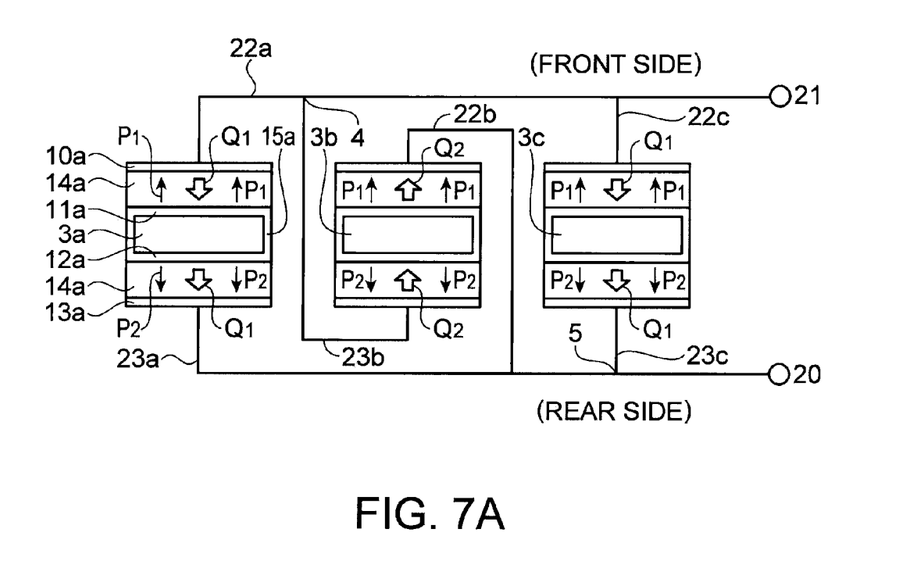
FIG. 7A is a schematic diagram showing the polarization direction of the piezoelectric layers, and wires of the upper electrodes and lower electrodes.
Figure 7B:
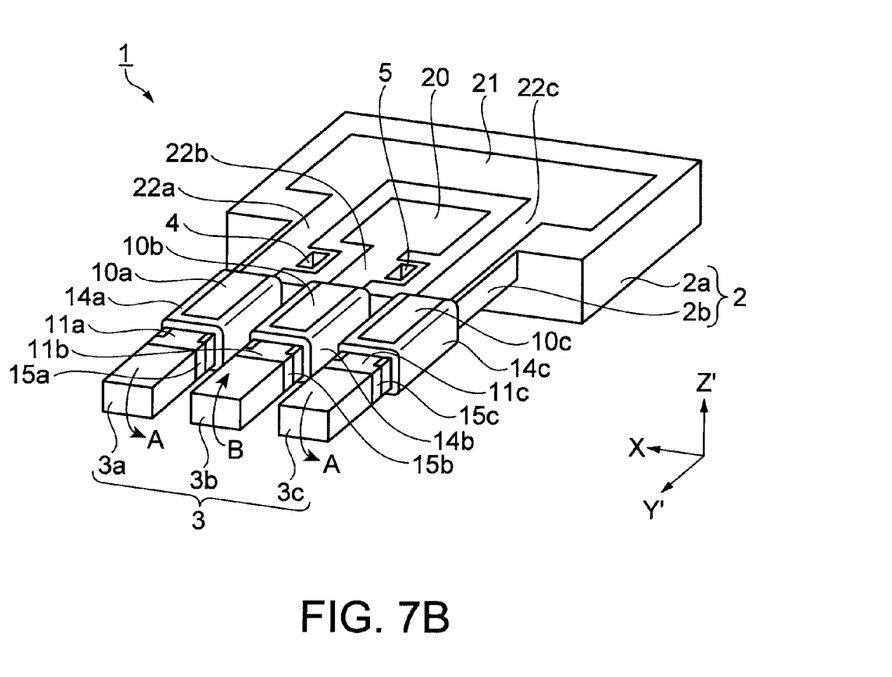
FIG. 7B is a perspective view showing the flexural directions of the crystal vibration piece.

Next, a description will be given of a principle by which the crystal vibration piece 1 flexurally vibrates. FIG. 7A is a schematic diagram showing the polarization direction of the piezoelectric layers, and the wires of the upper electrodes and lower electrodes, and FIG. 7B is a perspective view showing the flexural directions of the crystal vibration piece. FIG. 7A shows a cross-section wherein the portions of the vibrating arms 3 of the crystal vibration piece 1 on which the piezoelectric layers 14 are formed are cut in the X axis direction. As shown in FIGS. 7A and 7B, the piezoelectric layers 14 formed on each of the vibrating arms 3 have orientations in directions reversed between the front side and rear side of the vibrating arms 3, and the polarization directions also differ. The piezoelectric layer 14a formed on the front side of the vibrating arm 3a, for example, has a polarization direction P1 such that spontaneous polarization in the piezoelectric layer in an unloaded condition is upward in the drawing. Meanwhile, the piezoelectric layer 14a formed on the rear side of the vibrating arm 3a has a polarization direction which, being a polarization direction P2 wherein spontaneous polarization in the piezoelectric layer in the same unloaded condition is downward in the drawing, is the opposite of the polarization direction P1. On the vibrating arms 3b and 3c too, the piezoelectric layers 14 on the front sides and those on the rear sides have mutually opposite polarization directions.

Then, a drive voltage is applied to the crystal vibration piece 1 from the electrode terminal 20 or electrode terminal 21. For example, when a drive voltage is applied from the electrode terminal 21 to the electrode terminal 20, in the case of the vibrating arm 3a, it is first applied to the front side upper electrode 10a, then sequentially to the front side piezoelectric layer 14a, lower electrode 11a, electrode connection portion 15a, lower electrode 12a, rear side piezoelectric layer 14a, and upper electrode 13a, in a serially connected condition, reaching the electrode terminal 20. The drive voltage reaches the electrode terminal 20 from the upper electrode 13a through the electrode wire 23a, electrode wire 23c (FIGS. 1A and 1B), through hole 5, and electrode wire 22b. In the same way, in the case of the vibrating arm 3c, the drive voltage is first applied from the electrode terminal 21 to the front side upper electrode 10c, then sequentially to the front side piezoelectric layer 14c, lower electrode 11c, electrode connection portion 15c, lower electrode 12c, rear side piezoelectric layer 14c, and upper electrode 13c, in a serially connected condition, reaching the electrode terminal 20 through the electrode wire 23c, through hole 5, and electrode wire 22b. Meanwhile, in the case of the vibrating arm 3b, the drive voltage is first applied from the electrode terminal 21, through the electrode wire 22a, through hole 4, and electrode wire 23b, to the rear side upper electrode 13b, then sequentially to the rear side piezoelectric layer 14b, lower electrode 12b (FIGS. 1A and 1B), electrode connection portion 15b, lower electrode 11b, front side piezoelectric layer 14b, and upper electrode 10b, in a serially connected condition, reaching the electrode terminal 20 through the electrode wire 22b.

The polarization direction P1 of the piezoelectric layer 14a formed on the front side and the polarization direction P2 of the piezoelectric layer 14a formed on the rear side are mutually opposite polarization directions with respect to the vibrating arms 3. In this kind of voltage application condition, in the case of the vibrating arm 3a, as a drive current is applied in the same direction, in a direction from the front side to the rear side, to the front side piezoelectric layer 14a and rear side piezoelectric layer 14a, which are of opposite polarization directions, an electrical field Q1 oriented in the direction from the front side to the rear side is generated concurrently in both of the piezoelectric layers 14a. Because of this, the front side piezoelectric layer 14a, in which the polarization direction P1 and electrical field Q1 are opposite directions, is stretched due to the electrical field effect of the electrical field Q1, and the rear side piezoelectric layer 14a, in which the polarization direction P2 and electrical field Q1 are the same direction, is compressed due to the electrical field effect of the electrical field Q1. Due to this expansion and contraction, the vibrating arm 3a flexes in a rear side direction A. In the same way, the vibrating arm 3c also flexes in the rear side direction A. Meanwhile, in the case of the vibrating arm 3b, as a drive current is applied in the same direction, in a direction from the rear side to the front side, to the front side piezoelectric layer 14b and rear side piezoelectric layer 14b, which are of opposite polarization directions, an electrical field Q2 oriented in the direction from the rear side to the front side is generated concurrently in both of the piezoelectric layers 14b. Because of this, the front side piezoelectric layer 14b, in which the polarization direction P1 and electrical field Q2 are the same direction, is compressed due to the electrical field effect of the electrical field Q2, and the rear side piezoelectric layer 14b, in which the polarization direction P2 and electrical field Q2 are opposite directions, is stretched due to the electrical field effect of the electrical field Q2. Due to this contraction and expansion, the vibrating arm 3b flexes in a front side direction B. That is, the vibrating arms 3 positioned adjacent to each other flex in mutually reverse phases, performing a so-called out-of-plane vibration.

Also, on changing the direction of the drive current applied to the electrode terminal 20 and electrode terminal 21, the vibrating arms 3 each flex in the reverse direction. That is, by alternately changing the direction of the applied drive current, the crystal vibration piece 1, the vibrating arms 3 repeatedly flexing, can perform a stable vibration.

Hereafter, advantages of the crystal vibration piece 1 as the flexural vibration piece described in the embodiment will be summarized.

1. The crystal vibration piece 1 includes the piezoelectric layers 14 on the first surfaces 6 and second surfaces 7 disposed facing the directions in which the vibrating arms 3 flexurally vibrate, and the piezoelectric layers 14 are formed so as to have orientations in opposite directions with respect to the vibrating arms 3, and have mutually opposite polarization directions. For this reason, the crystal vibration piece 1 can cause the vibrating arms 3 to flexurally vibrate by generating an electrical field in the same direction in the piezoelectric layers 14 on the front and rear of the vibrating arms 3, and furthermore, by alternately changing the direction of the electrical field. As an electrical field is generated in the same direction in the piezoelectric layers 14 in this way, even in the event that one of the piezoelectric layers 14 is affected by the electrical field on the opposite side of the vibrating arms 3, the contraction or expansion of the affected piezoelectric layer 14 is not impeded. That is, the crystal vibration piece 1 is such that, while maintaining the vibration characteristics, it is possible to make the vibrating arms 3 thinner, and a further downsizing is possible.

2. As the lower electrodes 11 and lower electrodes 12 are connected by the electrode connection portions 15, the drive current in the vibrating arms 3 of the crystal vibration piece 1 is applied serially through a path in the order of the upper electrodes 10 of the first surfaces 6 to the upper electrodes 13 of the second surfaces 7, or the reverse order. Also, it being possible to integrally form the lower electrodes 11 and 12, and electrode communication portions 15, on the perimeter of the vibrating arms 3 simultaneously, there is no need to provide a long wire for a conductive connection. Then, on the vibrating arms 3, the wires extending from each of the upper electrodes 10 and 13 are easily provided on the first surfaces 6 side and second surfaces 7 side via the through holes 4 and 5. In this way, the crystal vibration piece 1 is such that, the wires for applying the drive current not being complexly adjacent or intersecting, the wires can be formed easily. Because of this, even though the crystal vibration piece 1 is downsized, it is possible to suppress an increase in parasitic capacity, and an occurrence of crosstalk, or the like. Also, in JP-A-2009-5022, as the piezoelectric layer is formed on only one side of the vibrating arm of the crystal vibration piece, the vibrating arm is subjected to a large stress after the formation of the piezoelectric layer, and it may happen that a crack forms in the vibrating arm, and that the vibrating arm breaks, but in the invention, the piezoelectric layers 14 are formed on both sides of the vibrating arms 3 of the crystal vibration piece 1, and stress caused by the piezoelectric layer is neutralized between the front and rear sides, so it is possible to reduce breakage of the vibrating arms during the manufacturing process.

3. The crystal vibration piece 1 includes the three vibrating arms 3a, 3b, and 3c, and their alignment direction is a direction intersecting with the directions in which the vibrating arms 3 flexurally vibrate. As adjacent vibrating arms 3 each vibrate in mutually reverse phases, that is, flexing in opposite directions, the crystal vibration piece 1 is such that, the plurality of vibrating arms 3 being balanced, it is possible to maintain a stabler vibration with little vibration energy leak.

Also, the flexural vibration piece and flexural vibration piece manufacturing method not being limited to the crystal vibration piece 1 in the heretofore described embodiment, the same kinds of advantage as in the embodiment can also be obtained with the kinds of configuration in the modification examples cited hereafter.

Modification Example 1

The crystal vibration piece 1 includes the three vibrating arms 3a, 3b, and 3c, and performs a so-called out-of-plane vibration but, not being limited to this, the vibration piece may be of a configuration including a number of vibrating arms 3 other than three, and furthermore, may be of a configuration such that it performs an in-plane vibration wherein the vibrating arms are disposed in the vibration direction, rather than an out-of-plane vibration.

Modification Example 2

The lower electrodes 11 and 12 of the crystal vibration piece 1 are a metal film with a two-layer structure of titanium (Ti) and platinum (Pt) in order to promote the orientation of the aluminum nitride (AlN) but, not being limited to this, they may also be a metal film with a single layer structure of titanium (Ti), or the like, provided that it promotes the orientation of the aluminum nitride (AlN).

Modification Example 3

The piezoelectric layers 14 of the crystal vibration piece 1 are of aluminum nitride (AlN) formed by means of a reactive sputtering but, not being limited to this, they may also be of, for example, zinc oxide (ZnO), which has piezoelectricity. Furthermore, insulating films (or protective films) may also be inserted between the piezoelectric layers 14 and upper electrodes 10 and 13 in order to increase insulation. Specifically, films of silicon dioxide ($SiO_2$), silicon nitride ($Si_3N_4$), or alumina ($Al_2O_3$) are formed as insulating layers. The insulating films may also be used to control temperature characteristics of inherent vibration frequencies.

Modification Example 4

Then, in the event that the piezoelectric layers 14 are of zinc oxide (ZnO), it is preferable, in order to promote the orientation of the zinc oxide (ZnO), that a metal film of a two-layer structure wherein chrome (Cr) is formed as a lower layer film, and gold (Au) is formed on top of the chrome (Cr) as an upper layer film, or a metal film of a two-layer structure wherein titanium (Ti) is formed as a lower layer film, and gold (Au) is formed on top of the titanium (Ti) as an upper layer film, is used as the lower electrodes 11 and 12. Then, it is preferable that a metal film of a two-layer structure wherein chrome (Cr) is formed as a lower layer film, and gold (Au) is formed on top of the chrome (Cr) as an upper layer film, or a single layer metal film of aluminum (Al), is used as the upper electrodes 10 and 13.

Modification Example 5

The flexural vibration piece, not being limited to one using a crystal like the crystal vibration piece 1, may also be a piezoelectric body of lithium niobate (LiNbO₃), lead zirconate titanate (PZT), or the like, or a semiconductor of silicon, or the like. However, the vibration frequency of the flexural vibration piece being proportional to the square root of a value of the Young's modulus of the flexural vibration piece material divided by the mass density, the smaller the value of the Young's modulus divided by the mass density, the more advantageous the material in downsizing the flexural vibration piece.

Modification Example 6

The flexural vibration piece not being limited to one wherein the lower electrodes and upper electrodes formed on each of the first surfaces and second surfaces of the vibrating arms are conductively connected to each other by an electrical connection being made, as in the crystal vibration piece 1, it may also be one wherein the upper electrodes formed on the first surface side of the vibrating arms, and the lower electrodes formed on the second surface side, are conductively connected, and the lower electrodes formed on the first surface side and the upper electrodes formed on the second surface side are conductively connected. Also, not being limited to the condition wherein the upper electrode 10a, front side piezoelectric layer 14a, lower electrode 11a, electrode connection portion 15a, lower electrode 12a, rear side piezoelectric layer 14a, and upper electrode 13a are serially connected, as in the crystal vibration piece 1, a configuration wherein the lower electrodes and upper electrodes are connected in parallel is also acceptable.

As the crystal vibration piece 1 as the flexural vibration piece includes the piezoelectric layers 14, with differing polarization directions with respect to the vibrating arms 3, on the front and rear of the vibrating arms 3, and the piezoelectric layers 14 are connected in series, the wiring can be simplified, and it is possible to achieve a suppression of crosstalk, and a downsizing. Due to this characteristic, the crystal vibration piece 1 is extensively used as a timing device, or the like, in electronic apparatus such as a digital portable telephone, personal computer, electronic clock, video recorder, and television. Then, a crystal vibrator in which the crystal vibration piece 1 is packaged, a flexural vibration device including the crystal vibration piece 1 and a semiconductor element which drives the crystal vibration piece 1, and the like, can also be downsized, and it is possible to contribute to a downsizing of an electronic apparatus in which they are mounted.

The entire disclosure of Japanese Patent Application No. 2009-143984, filed Jun. 17, 2009 is expressly incorporated by reference herein.

What is claimed is:

1. A flexural vibration piece comprising:

a base portion;

first and second vibrating arms extending from the base portion, each of the first and second vibrating arms having a first surface, a second surface opposing the first surface, and side surfaces connecting the first surface and the second surface, wherein the first vibrating arm has a first laminated structure including a first electrode, a second electrode, and a first piezoelectric layer disposed between the first electrode and the second electrode, the first laminated structure is formed on each of the first surface and the second surface, and the first electrode is disposed between the first surface and the first piezoelectric layer and between the second surface and the first piezoelectric layer, the first piezoelectric layer formed on the first surface side and the first piezoelectric layer formed on the second surface side have mutually opposite polarization directions, the first electrode formed on the first surface side and the first electrode formed on the second surface side are connected to each other, the second vibrating arm has a second laminated structure including a third electrode, a fourth electrode, and a second piezoelectric layer disposed between the third electrode and the fourth electrode, the second laminated structure is formed on each of the first surface and the second surface, and the third electrode is disposed between the first surface and the second piezoelectric layer and between the second surface and the second piezoelectric layer, the second piezoelectric layer formed on the first surface side and the second piezoelectric layer formed on the second surface side have mutually opposite polarization directions, the third electrode formed on the first surface side and the third electrode formed on the second surface side are connected to each other, the second electrode formed on the first surface side of the first vibrating arm and the fourth electrode formed on the second surface side of the second vibrating arm are connected to each other, the second electrode formed on the second surface side of the first vibrating arm and the fourth electrode formed on the first surface side of the second vibrating arm are connected to each other, and a first voltage applied to the second electrode formed on the first surface side of the first vibrating arm is different from a second voltage applied to the second electrode formed on the second surface side of the first vibrating arm.

2. The flexural vibration piece according to claim 1, wherein when a third voltage is applied between the second electrode formed on the first surface side and the second electrode formed on the second surface side, the polarization direction and an electrical field direction in the first piezoelectric layer formed on one of the first surface side and second surface side are the same as each other, and the polarization direction and electrical field direction in the first piezoelectric layer formed on the other surface side are mutually opposite.

3. The flexural vibration piece according to claim 1, wherein
the first and second piezoelectric layers are formed on the first surface, the second surface, and the side surfaces of each of the first and second vibrating arms.

4. The flexural vibration piece according to claim 1, wherein
the first electrode formed on the first surface side and the first electrode formed on the second surface side are electrically floating.

5. The flexural vibration piece according to claim claim 1, wherein
adjacent the first and second vibrating arms flexurally vibrate in mutually opposite directions.

6. A flexural vibrator which houses the flexural vibration piece according to claim 1 in a package.

7. An electronic apparatus comprising the flexural vibration piece according to claim 1.

* * * * *